(12) United States Patent
Hawn et al.

(10) Patent No.: US 10,818,992 B2
(45) Date of Patent: Oct. 27, 2020

(54) INTEGRATED SPRING MOUNTED CHIP TERMINATION

(71) Applicant: Smiths Interconnect Americas, Inc., Kansas City, KS (US)

(72) Inventors: Christopher Raymond Hawn, Port St. Lucie, FL (US); Michael Joseph Kettner, Stuart, FL (US)

(73) Assignee: SMITHS INTERCONNECT AMERICAS, INC., Kansas City, KS (US)

( * ) Notice: Subject to any disclaimer, the term of this patent is extended or adjusted under 35 U.S.C. 154(b) by 47 days.

(21) Appl. No.: 16/333,990

(22) PCT Filed: Sep. 22, 2017

(86) PCT No.: PCT/US2017/052961
§ 371 (c)(1),
(2) Date: Mar. 15, 2019

(87) PCT Pub. No.: WO2018/057893
PCT Pub. Date: Mar. 29, 2018

(65) Prior Publication Data
US 2019/0296413 A1    Sep. 26, 2019

Related U.S. Application Data

(60) Provisional application No. 62/402,828, filed on Sep. 30, 2016, provisional application No. 62/398,142, filed on Sep. 22, 2016.

(51) Int. Cl.
*H01P 1/26* (2006.01)
*H03H 7/38* (2006.01)
(Continued)

(52) U.S. Cl.
CPC ............... *H01P 1/26* (2013.01); *H01L 23/66* (2013.01); *H01L 24/73* (2013.01); *H03H 7/38* (2013.01);
(Continued)

(58) Field of Classification Search
CPC ... H01P 1/26; H01P 1/24; H01P 1/268; H01L 23/647; H01L 23/66; H01L 23/40;
(Continued)

(56) References Cited

U.S. PATENT DOCUMENTS

| 5,841,340 A | 11/1998 | Passaro, Jr. et al. |
| 2004/0119551 A1* | 6/2004 | Wray ............... H01P 1/268 333/22 R |

(Continued)

FOREIGN PATENT DOCUMENTS

| JP | 04125903 | 4/1992 |
| JP | 3 768075 | 4/2006 |

*Primary Examiner* — Stephen E. Jones
(74) *Attorney, Agent, or Firm* — Snell & Wilmer LLP

(57) ABSTRACT

An integrated spring mounted chip termination for converting energy of a circuit into heat to be absorbed by a heatsink. The integrated spring mounted chip termination includes an input tab configured to connect to the circuit. The integrated spring mounted chip termination also includes a chip termination having a top surface. The chip termination includes an input contact located on the top surface and configured to connect to the input tab, a resistor element located on the top surface and connected to the input contact, and a ground contact located on the top surface and connected to the resistor element. The integrated spring mounted chip termination also includes a formed ground spring connected to the ground contact of the chip termination, the formed ground spring configured to attach the chip termination to the heatsink, such that the chip termination and the heatsink are in contact.

20 Claims, 9 Drawing Sheets

(51) Int. Cl.
*H05K 7/20* (2006.01)
*H01L 23/00* (2006.01)
*H01L 23/66* (2006.01)
*H01L 23/40* (2006.01)
*H01C 13/00* (2006.01)

(52) U.S. Cl.
CPC ............ H05K 7/2049 (2013.01); *H01C 13/00* (2013.01); *H01L 23/40* (2013.01); *H01L 24/29* (2013.01); *H01L 24/32* (2013.01); *H01L 24/37* (2013.01); *H01L 24/84* (2013.01); *H01L 2224/291* (2013.01); *H01L 2224/32225* (2013.01); *H01L 2224/37011* (2013.01); *H01L 2224/37013* (2013.01); *H01L 2224/73213* (2013.01); *H01L 2224/84801* (2013.01)

(58) Field of Classification Search
CPC ........ H03H 7/38; H05K 7/2049; H01C 13/00; H01C 13/02
USPC ....................................................... 333/22 R
See application file for complete search history.

(56) References Cited

U.S. PATENT DOCUMENTS

| | | | |
|---|---|---|---|
| 2005/0213993 | A1 | 9/2005 | Kazemi-Nia et al. |
| 2014/0285389 | A1 | 9/2014 | Fakharzadeh et al. |
| 2015/0156910 | A1 | 6/2015 | Zhu et al. |
| 2015/0349396 | A1 | 12/2015 | Aead |
| 2015/0351275 | A1 | 12/2015 | Imbimbo et al. |

\* cited by examiner

VNA: 37347C

MODEL. 32-7172  DATE: 10/28/2015 09:36
DEVICE ID: 01  OPERATOR: EMCT
CALSET; P14GF488 FX0488 SHIM@10
START: 0.040000 GHz  GATE START: -  ERROR CORR: REFL PORT1
STOP: 4.040000 GHz  GATE STOP: -  AVERAGING: 1 PT
STEP: 0.010000 GHz  GATE: -  IF BNDWDTH: 1 KHz
WINDOW: -

|  | ----CH1---- | ----CH3---- |
|---|---|---|
| PARAMETER: | -S11- | -S11- |
| NORMALIZATION: | OFF | OFF |
| REFERENCE PLANE: | 10.1252 cm | 0.0000 mm |
| SMOOTHING: | 0.0 PERCENT | 0.0 PERCENT |
| DELAY APERTURE: | - | - |

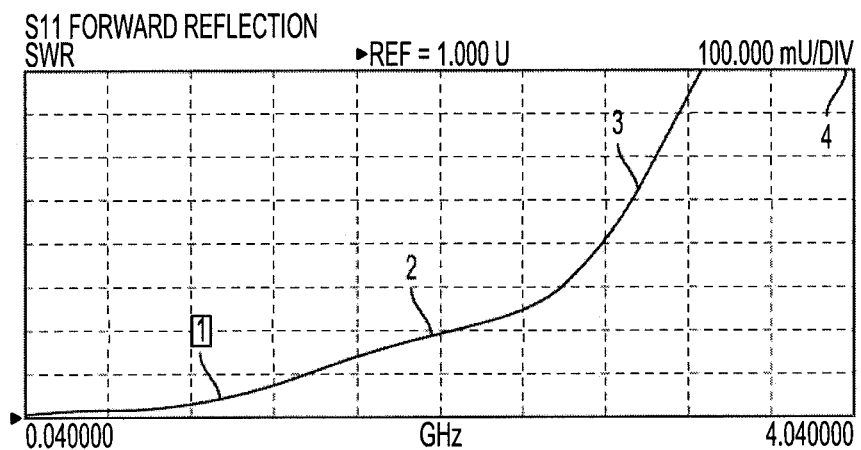

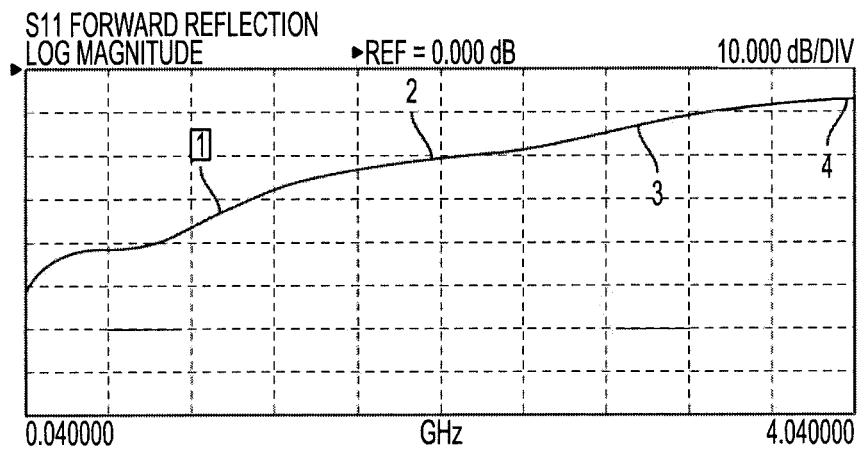

CH 1 - S11
  10.1252 cm REF
  0.000 dB OFFSET
  0.00°   OFFSET

►MARKER 1
  1.000000 GHz
  1.043 U

MARKER TO MAX
MARKER TO MIN 2  2.000000 GHz
   1.189 U 3  3.000000 GHz
   1.519 U 4  4.000000 GHz
   2.390 U

MARKER READOUT
FUNCTIONS

FIG. 6

INTEGRATED SPRING MOUNTED CHIP TERMINATION

CROSS REFERENCE TO RELATED APPLICATIONS

This application claims the benefit and priority of U.S. Provisional Application Ser. No. 62/398,142, filed Sep. 22, 2016, entitled "Integrated Ground Tab Chip Termination," and U.S. Provisional Application Ser. No. 62/402,828, filed Sep. 30, 2016, entitled "Integrated Spring Mounted Chip Termination," the contents of each of which are herein incorporated by reference in their entirety.

BACKGROUND

1. Field of the Invention

The present invention relates to chip terminations, and more particularly to chip terminations in radio frequency (RF) and microwave circuits.

2. Description of the Related Art

Chip terminations are used at the end of a circuit to terminate a signal to ground by converting RF energy into heat. Chip terminations may be designed to dissipate the heat and have a low voltage standing wave ratio (VSWR) in order to prevent the signal from being reflected back into the circuit. Conventional chip terminations may be mounted on flanges for use in applications where heatsinking may be employed with power ratings in the range of 5-2500 watts. The arrangement of components in a conventional flange mount may result in an inherent thermal expansion mismatch when a ceramic chip is mounted on a metal flange, typically made from copper.

SUMMARY OF THE INVENTION

According to some embodiments, an integrated spring mounted chip termination for converting energy of a circuit into heat to be absorbed by a heatsink is disclosed. The integrated spring mounted chip termination includes an input tab configured to connect to the circuit. The integrated spring mounted chip termination also includes a chip termination having a top surface. The chip termination includes an input contact located on the top surface and configured to connect to the input tab, a resistor element located on the top surface and connected to the input contact, and a ground contact located on the top surface and connected to the resistor element. The integrated spring mounted chip termination also includes a formed ground spring connected to the ground contact of the chip termination, the formed ground spring configured to attach the chip termination to the heatsink, such that the chip termination and the heatsink are in contact.

A system for converting energy of a circuit into heat to be absorbed by a heatsink is disclosed. The system includes an input tab configured to connect to the circuit. The system also includes a chip termination having a top surface. The chip termination includes an input contact printed on the top surface and configured to connect to the input tab. The chip termination also includes a resistor element printed on the top surface and connected to the input contact. The chip termination also includes a ground contact printed on the top surface and connected to the resistor element. The system also includes a formed ground spring connected to the ground contact of the chip termination, the formed ground spring configured to attach the chip termination to the heatsink, such that the chip termination and the heatsink are in contact.

A method for manufacturing an integrated spring mounted chip termination is disclosed. The method includes fabricating a chip termination by printing an input contact, an inductive tuning element, a resistor element, and a ground contact onto a top surface of a dielectric material. The method also includes connecting a bottom surface of a formed ground spring to the ground contact of the chip termination. The method also includes connecting a bottom surface of an input tab to the input contact of the chip termination. The method also includes connecting a bottom surface of a lid to a top surface of the input tab and a top surface of the formed ground spring.

BRIEF DESCRIPTION OF THE DRAWINGS

The features and advantages of the embodiments of the present disclosure will become more apparent from the detailed description set forth below when taken in conjunction with the drawings. Naturally, the drawings and their associated descriptions illustrate example arrangements within the scope of the claims and do not limit the scope of the claims. Reference numbers are reused throughout the drawings to indicate correspondence between referenced elements.

FIG. 6 is test data of a conventional flange mount termination.

DETAILED DESCRIPTION

In the following detailed description, numerous specific details are set forth to provide an understanding of the present disclosure. It will be apparent, however, to one ordinarily skilled in the art that elements of the present disclosure may be practiced without some of these specific details. In other instances, well-known structures and techniques have not been shown in detail to avoid unnecessarily obscuring the present disclosure.

Terminations (or loads) may be used in radio frequency (RF) and microwave circuits. The integrated spring mounted chip termination, as described herein, may be an alternative to conventional flange mount terminations and other resistive devices. The integrated spring mounted chip termination may improve power handling capability while at the same time improving the voltage standing wave ratio (VSWR), a critical parameter when operating in the frequency (RF) and microwave region of the RF spectrum. The integrated spring mounted chip termination, as described herein, also eliminates the thermal expansion mismatch when ceramic chips are mounted with solder to copper flanges. While conventional flange mount terminations may use copper tungsten flanges to address thermal expansion mismatch, the poor thermal conductivity of copper tungsten may cause poor thermal performance. Adding the ground features to the chip itself contributes to the improved performance of the integrated spring mounted chip termination.

Figure 1A:
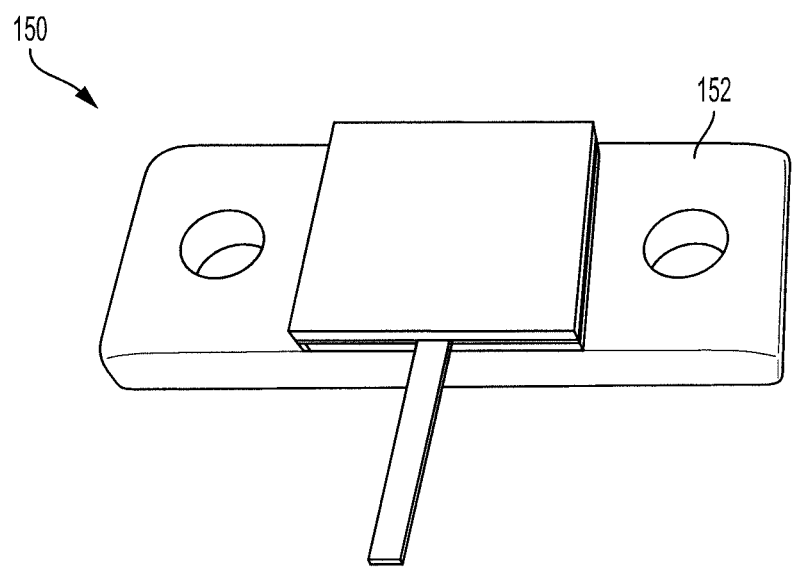
FIG. 1A illustrates a conventional flange mount termination.

FIG. 1A shows a conventional flange mount termination 150.

Conventional flange mount termination 150 includes a flange 152 made of copper or copper tungsten or other materials. The use of flange 152 may create thermal expansion mismatch issues, as described herein.

Figure 1B:
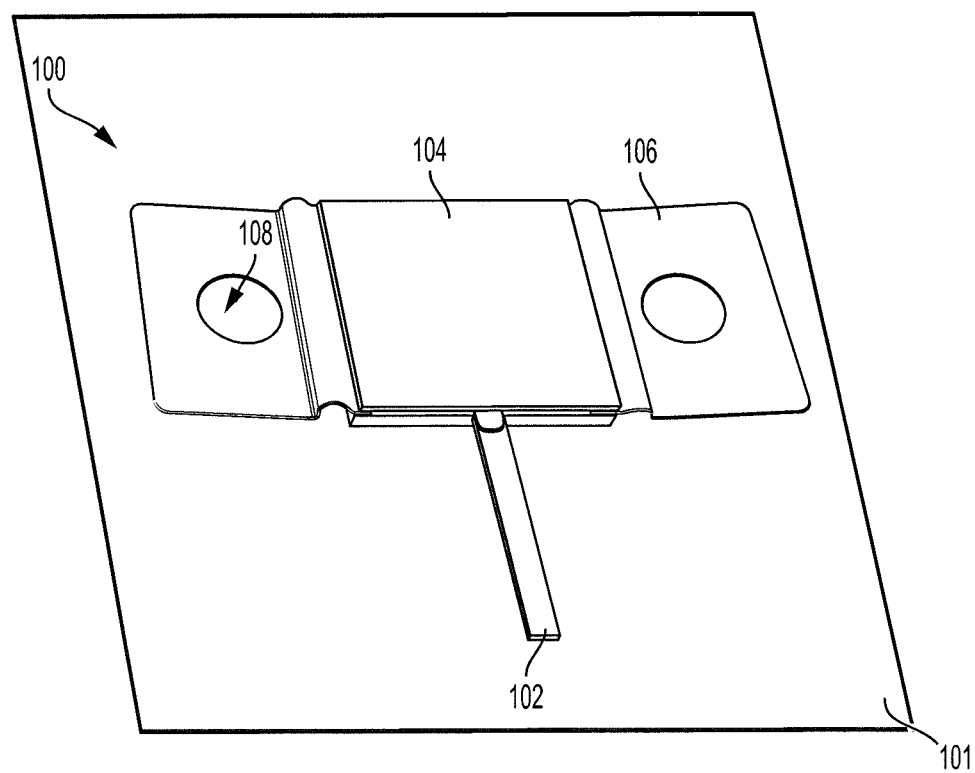
FIG. 1B illustrates an integrated spring mounted chip termination according to an embodiment of the invention.

FIG. 1B illustrates an integrated spring mounted chip termination 100 according to an embodiment of the invention. Integrated spring mounted chip termination 100 includes an input tab 102, a formed ground spring 106, and a lid 104. The lid 104 may be made of ceramic. The formed ground spring 106 includes mounting holes 108 for attaching the integrated spring mounted chip termination 100 to a heatsink 101. In some embodiments, a screw, bolt, or other fastener is placed through the mounting hole 108 and used to attach the integrated spring mounted chip termination 100 to the heatsink 101.

The configuration of integrated spring mounted chip termination 100 eliminates the need for a mounting flange 152 underneath the chip. Removing the flange 152 eliminates a thermal layer and significantly increases the power handling of a chip termination of the integrated spring mounted chip termination 100. This allows for the chip termination to be directly mounted to the heatsink 101 with a thin layer of thermal grease.

Figure 2A:
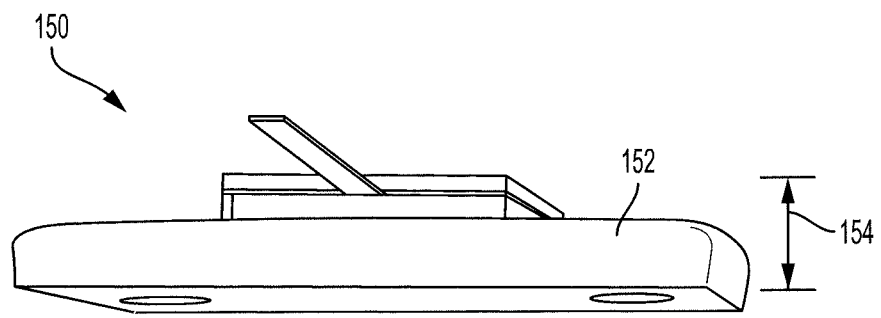
FIG. 2A is a bottom view of the conventional flange mount termination of FIG. 1A.
Figure 2B:
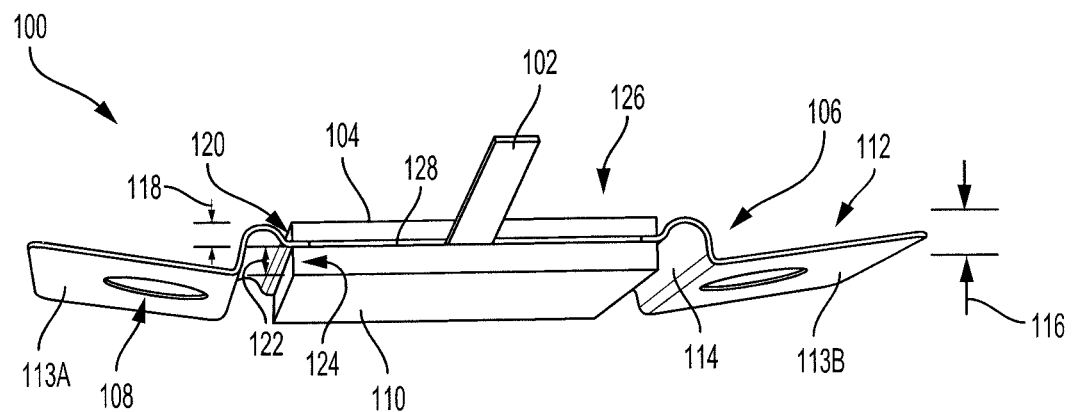
FIG. 2B is a bottom view of the integrated spring mounted chip termination of FIG. 1B according to an embodiment of the invention.

FIG. 2A is a bottom view of the conventional flange mount termination 150 of FIG. 1A. FIG. 2B is an integrated spring mounted chip termination 100 according to an embodiment of the invention.

Integrated spring mounted chip termination 100 includes chip termination 110. Input tab 102 is located between the chip termination 110 and the lid 104. The shape of the formed ground spring 106 is such that a gap 128 exists between the lid 104 and the chip termination 110. The input tab 102 is located in the gap 128, which may be more readily apparent in FIG. 5B. The thickness of input tab 102 may correspond with the thickness of formed ground spring 106 at the body portion 126.

The formed ground spring 106 includes a body portion 126 and wing portion 112. The wing portion 112 may refer to one or more wings 113 of the formed ground spring 106 which extend outward from the body portion 126 of the formed ground spring 106. The wing portion 112 as shown in FIG. 2 has two wings 113A and 113B, but in other embodiments, there may be a single wing or three or more wings. The wings of the wing portion 112 may be substantially flat and made of the same material as the body portion 126. The body portion 126 may form a first plane, and the wings 113 may form additional planes (e.g., a second plane formed by wing 113A and a third plane formed by wing 113B). In an uninstalled state, the first plane and the additional planes may intersect at a line, and in an installed state (when the integrated spring mounted chip termination 100 is connected to the heatsink), the first plane and the additional planes may be parallel.

The mounting hole 108 is located on a wing 113 of the wing portion 112 of the formed ground spring 106. The chip termination 110 may be connected to a heatsink using a thin layer of thermal grease, instead of via the flange 152 of the conventional flange mount termination 150. The wing portion 112 may be angled relative to the chip termination 110 such that when the integrated spring mounted chip termination 100 is mounted to the heatsink, there is a force against the chip termination 110 onto the heatsink.

The wing portion 112 is connected to the body portion 126 at a bend 114. FIG. 2 illustrates the bend 114 as being a curved, semi-circular bend. However, in other embodiments, bend 114 may be more of a step or a ramp, forming a first angle between the body portion 126 and the bend 114, and a second angle between the bend 114 and the wing portion 112. The geometry of the bend 114 may create an angle between the wing portion 112 and the body portion 126. This angle may be such that a rotational force about the bend 114 is established, either lifting the bottom of the chip termination 110 away from the heat sink or pushing the bottom of the chip termination 110 toward the heat sink, when the wing portion 112 is attached to the heat sink via connectors inserted into the mounting holes 108.

The lid 104 has a lid thickness 120 and the chip termination 110 has a chip termination thickness 124. Accordingly, the space from the top surface of the body portion 126 to the top of the bend 114 may have a height 118 which will accommodate for the lid thickness 120, and the space from the bottom surface of the body portion 126 to the bottom of the bend 114 may have a height 122 which will accommodate for the chip termination thickness 124.

In some embodiments, the height 122 is also such that the bottom surface of the chip termination 110 is substantially coplanar with the bottom surface of the wing portion 112 of the formed ground spring 106 when the integrated spring mounted chip termination 100 is attached to the heatsink.

Eliminating the flange 152 may remove concerns of thermal expansion mismatch caused by soldering a chip made of ceramic to a metal flange typically made from copper. The coefficient of thermal expansion (CTE) of oxygen free copper is 17.7 ppm/° C. and the CTE of common ceramics used in chips range from 4.5-9.0 ppm/° C. Removing the flange 152 may also provide improved VSWR due to the increased ground on the top of the chip. Accordingly, integrated spring mounted chip termination 100 maximizes power dissipation while providing good RF performance. Integrated spring mounted chip termination 100 may be used in high power terminations and other resistive products.

In addition, removing the flange 152 allows the integrated spring mounted chip termination 100 to have a reduced profile, as the height 116 of the integrated spring mounted chip termination 100 is less than the height 154 of the conventional flange mount termination 150.

Figure 3:
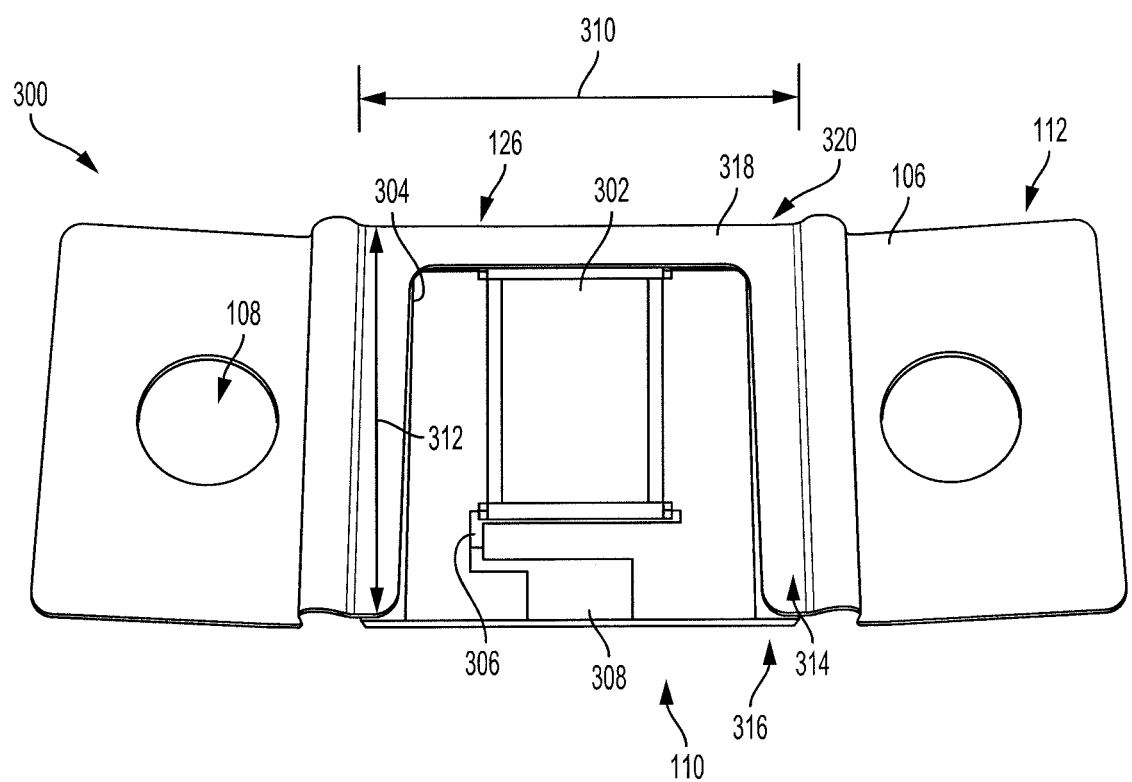
FIG. 3 shows a spring mounted installation on a chip termination according to an embodiment of the invention.

FIG. 3 is a formed ground spring (or ground tab) 106 installation on a chip termination 110 according to an embodiment of the invention. Assembly 300 illustrated in FIG. 3 may be similar to integrated spring mounted chip termination 100 without the input tab 102 and the lid 104 being shown.

As shown in FIG. 3, chip termination 110 includes a resistor element 302, a ground contact 304, and an inductive tuning element 306. The formed ground spring 106 may be connected to the chip termination 110 at the ground contact 304. The formed ground spring 106 may be attached to the ground contact 304 via soldering.

Also as shown in FIG. 3, the formed ground spring 106 has a body portion 126 and a wing portion 112. The body portion 126 has a width 310 and a length 312. In some embodiments, the width 310 and the length 312 are substantially the same, rendering the shape of the body portion 126 to be a square. In other embodiments, the width 310 and the length 312 are different such that the body portion 126 is rectangular.

The formed ground spring 106 has a top surface 318 and a bottom surface 320. The body portion 126 has a top receiving portion 314 for the lid 104 located on the top surface 318. The top receiving portion 314 for the lid 104 is configured to receive the lid 104, as described herein. The body portion 126 also has a bottom receiving portion 316 for the chip termination 110 located on the bottom surface 320. The bottom receiving portion 316 for the chip termination 110 is configured to receive the chip termination 110.

As shown in FIG. 3, the body portion 126 makes contact with the ground contact 304 of the chip termination 110. In some embodiments, the body portion 126 makes contact with only the ground contact 304 of the chip termination 110, and with no other portion of the chip termination 110. Accordingly, the body portion 126 may have a shape corresponding to the shape of the ground contact 304 of the chip termination 110.

Also as shown in FIG. 3, the input contact 308 is located along a first side of the chip termination 110, and the body portion 126 of the formed ground spring 106 is shaped such that the body portion 126 is substantially open along the first side of the chip termination 110 where the input contact 308 is located.

Figure 4:
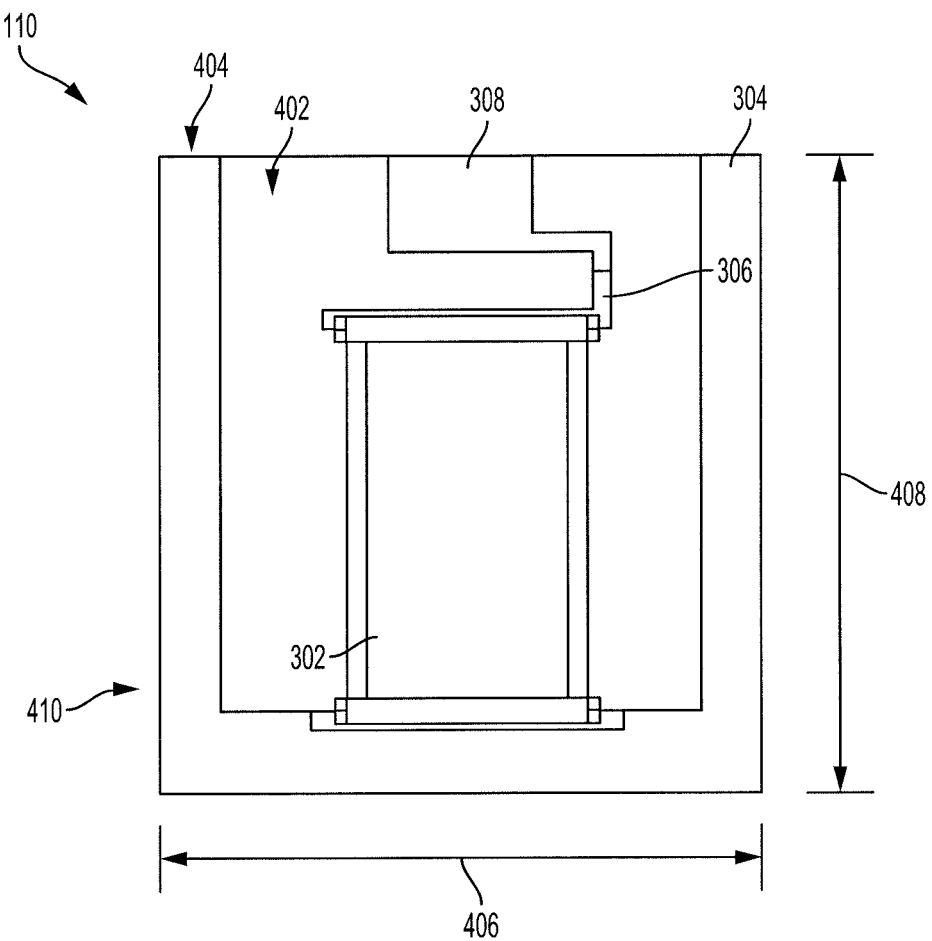
FIG. 4 shows a chip termination according to an embodiment of the invention.

FIG. 4 is a chip termination 110 according to an embodiment of the invention. The chip termination 110 may have a perimeter 410 around a top surface 402, and the ground contact 304 may be located on the top surface 402 along at least a portion of the perimeter 410. As seen in FIG. 4, the ground contact 304 is located on three sides of the perimeter 410 of the top surface 402 of chip termination 110. The formed ground spring 106 may be attached to the chip termination 110 on the three ground contact sides of the top surface 402 of chip termination 110.

The chip termination 110 has a width 406 and a length 408. While the top of chip termination 110 is shown as being a rectangle (e.g., a square) in shape, any type of shape or configuration may be used. For example, the chip termination 110 may be a circle or generally circular, and the formed ground spring 106 may be located on a portion of a circumference of the circular chip termination. The chip termination 110 may have a width 406 and a length 408 of any size. In some embodiments, the chip termination 110 is square shaped, and each side has a length of 0.375 inches. In other embodiments, the chip termination 110 is square shaped with each side having a length of 0.5 inches. In yet other embodiments, the chip termination 110 is square shaped with each side having a length of 1 inch.

Chip termination 110 includes a resistor element 302, ground contact 304, inductive tuning element 306, and input contact 308. The input tab 102 is configured to connect to a circuit, and the resistor element 302, the inductive tuning element 306, and the ground contact 304 are configured to convert the electrical energy received from the circuit into thermal energy to be absorbed by the heat sink.

The chip termination 110 may be fabricated using a substrate. The substrate may be a dielectric material. In some embodiments, the dielectric material is a ceramic, such as beryllium oxide or aluminum nitride. In some embodiments, the dielectric material is a plastic or a PCB material, such as silicon.

The input contact 308 may be printed on the dielectric material. The ground contact 304 may be printed on the dielectric material. The resistor element 302 may be printed on the dielectric material. The resistor element 302 may be located between the input contact 308 and the ground contact 304 and may connect the input contact 308 and the ground contact 304. The inductive tuning element 306 may be printed on the dielectric material and located between the input contact 308 and the resistor element 302, and may connect the input contact 308 and the resistor element 302.

As shown in FIG. 4, the ground contact 304 is located on the perimeter 410 of the top surface 402 of the chip termination 110, and the ground contact 304 is located on three of the four sides of the perimeter 410, occupying a substantial portion of the perimeter 410. Accordingly, one or more of the other elements of the chip termination 110 may be surrounded by the ground contact 304. The ground contact 304 may surround one or more of the resistor element 302, the inductive tuning element 306, or the input contact 308. In other embodiments, the ground contact 304 is located on two sides of the perimeter 410 of the top surface 402 of the chip termination 110.

While FIG. 4 shows the ground contact 304 occupying the entirety of the three of the four sides of the perimeter 410, in other embodiments, the ground contact 304 may occupy a portion of one or more sides of the perimeter 410. For example, the ground contact 304 may be located on an entirety of a first side, but may only occupy a portion of two other sides of the perimeter 410. In other words, in the example, the ground contact 304 may, in aggregate, run along half of the perimeter 410 of the chip termination 110, but the ground contact 304 may be distributed over three sides of the perimeter 410.

The surrounding ground contact 304 printed on the chip termination 110 also provides improved VSWR over the given frequency range. In addition, the VSWR is improved due to the increased ground on the top of the chip as the flange is connected to the top of the chip.

In general, the input contact 308 and the ground contact 304 may not be located at the same location along the perimeter 410. Accordingly, the formed ground spring 106 may not make contact with the input contact 308.

In some embodiments, the input contact 308 is directly connected to the inductive tuning element 306, which is directly connected to the resistor element 302, which is directly connected to the ground contact 304.

Figure 5A:
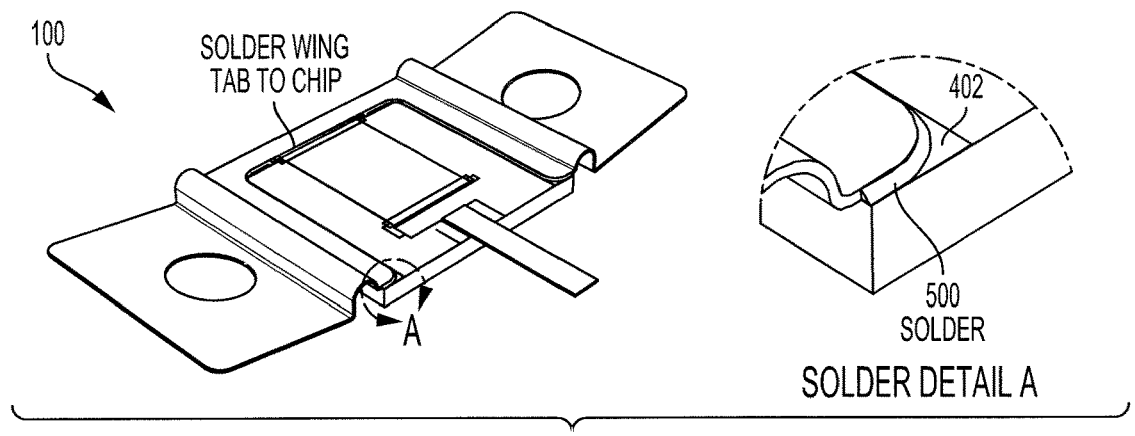
FIG. 5A is a perspective view of an integrated spring mounted chip termination showing soldering according to an embodiment of the invention.

FIG. 5A is a perspective view of the integrated spring mounted chip termination 100 showing solder 500 connecting the formed ground spring 106 to the chip termination 110. The solder 500 may be applied or deposited along the junction of the body portion 126 of the formed ground spring 106 and the chip termination 110. The solder 500 may be applied along a portion of the body portion 126 contacting the chip termination 110, or may be applied along the entire length of the body portion 126 contacting the chip termination 110.

Figure 5B:
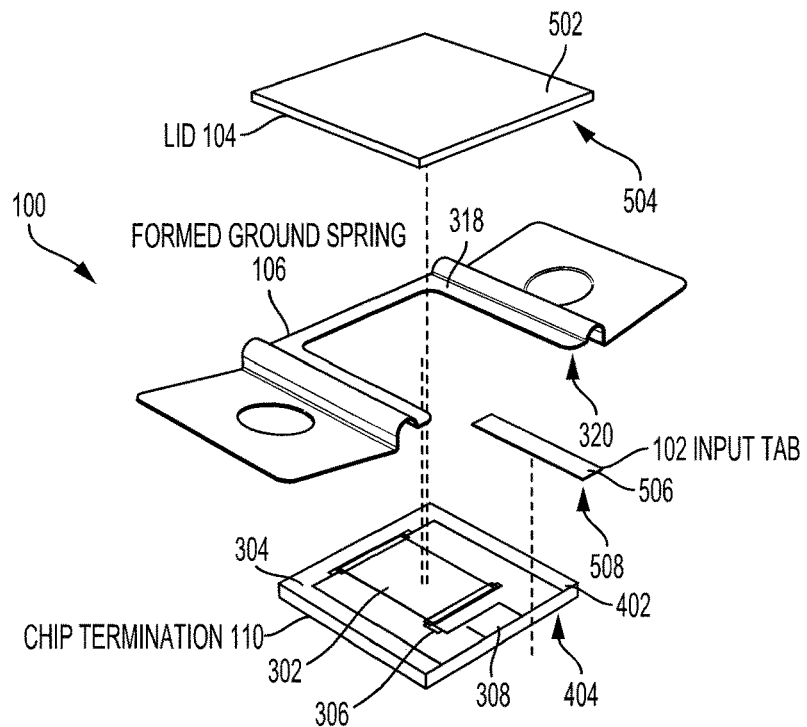
FIG. 5B is an exploded view of components of an integrated spring mounted chip termination according to an embodiment of the invention.

FIG. 5B is an exploded view of components of an integrated spring mounted chip termination 100 according to an embodiment of the invention. The lid 104 has a top surface 502 and a bottom surface 504. The formed ground spring 106 has a top surface 318 and a bottom surface 320. The input tab 102 has a top surface 506 and a bottom surface 508. The chip termination 110 has a top surface 402 and a bottom surface 404.

The formed ground spring 106, namely the body portion 126, and the input tab 102 are sandwichably connected to the lid 104 and the chip termination 110. The bottom surface 504 of the lid 104 contacts the top surface 318 of the formed ground spring 106. In particular, the lid 104 contacts the top surface 318 of the formed ground spring 106 that is a part of the body portion 126 of the formed ground spring 106. In this way, only a portion of the bottom surface 504 of the lid 104 directly contacts the top surface 318 of the formed ground spring 106.

The bottom surface 320 of the formed ground spring 106 contacts the top surface 402 of the chip termination 110. In particular, the bottom surface 320 of the formed ground spring 106 contacts the ground contact 304 of the chip termination 110 located on the top surface 402 of the chip termination 110.

The input tab 102 is connected to the input contact 308. The input tab 102 may be soldered to the input contact 308. The input tab 102 is also located between the lid 104 and the chip termination 110. Accordingly, the top surface 506 of the input tab 102 contacts the bottom surface 504 of the lid 104 and the bottom surface 508 of the input tab 102 contacts the top surface 402 of the chip termination 110. In particular, the bottom surface 508 of the input tab 102 contacts the input contact 308 portion of the chip termination 110.

In some embodiments, the lid 104 is directly connected to the formed ground spring 106 and the input tab 102. In these embodiments, the formed ground spring 106 is directly connected to the lid 104 and the chip termination 110 at the ground contact 304 of the chip termination 110. In these embodiments, the input tab 102 is directly connected to the lid 104 and the chip termination 110 at the input contact 308 of the chip termination 110. In these embodiments, the chip termination 110 is directly connected to the formed ground spring 106, the input tab 102, and the heat sink.

Figure 5C:
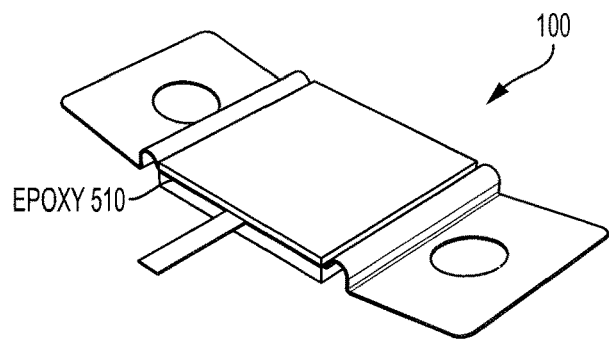
FIG. 5C is a perspective view of an assembled integrated spring mounted chip termination according to an embodiment of the invention.

FIG. 5C is a perspective view of the fully assembled integrated spring mounted chip termination 100. As shown in FIGS. 2B and 5B, gap 128 separates the lid 104 and the chip termination 110. The epoxy 510 may be used to connect the chip termination 110 with the lid 104 and may fill the gap 128. In some embodiments, the input tab 102 may be connected to a ground portion of a circuit that is also used as a spring to provide clamping force when mounted.

FIG. 6 is test data of a conventional flange mount termination, showing RF performance across a given frequency range.

Figure 7:
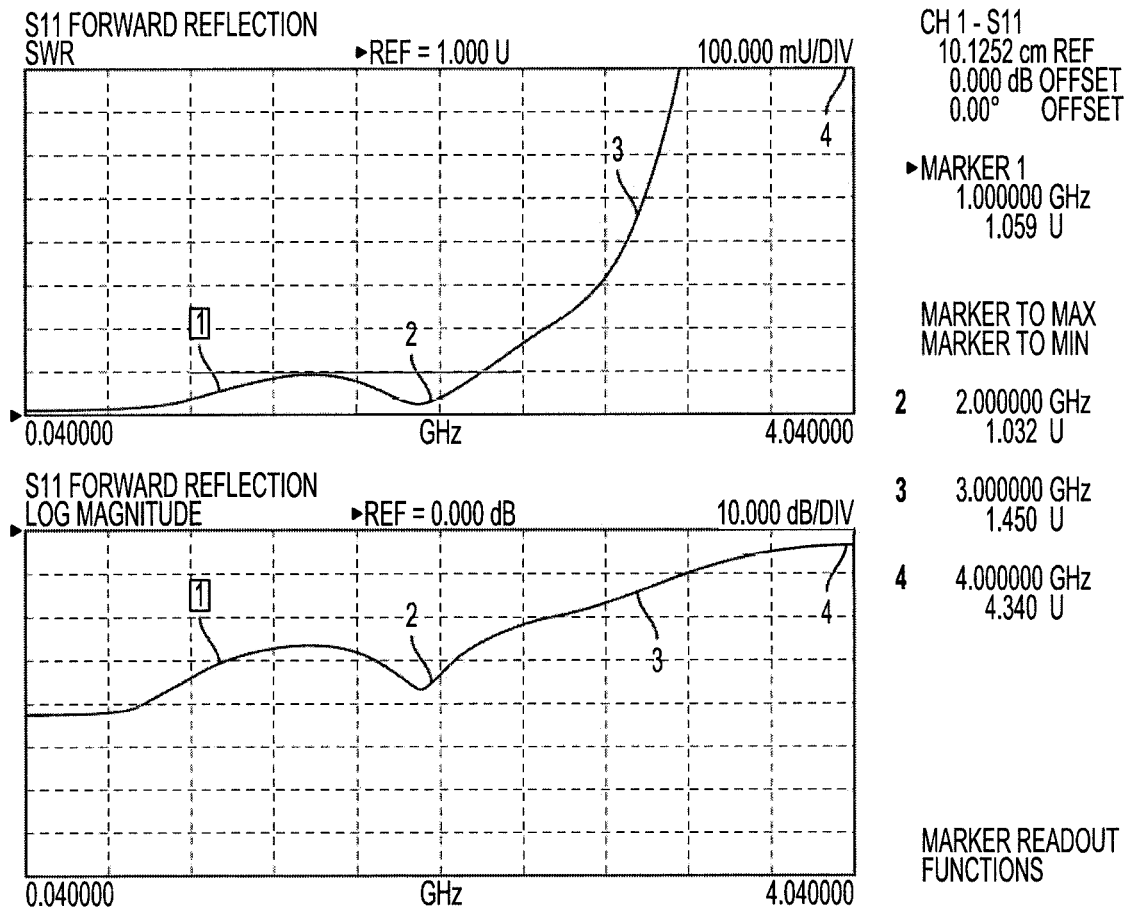
FIG. 7 is test data of an integrated spring mounted chip termination according to an embodiment of the invention.

FIG. 7 is test data of an integrated spring mounted chip termination according to an embodiment of the invention, showing RF performance across a given frequency range. The units of the top graph are in mU and the units of the bottom graph are in dB. The VSWR, shown by markers 1-4, of the integrated spring mounted chip termination is improved as compared to the conventional flange mount termination, and the return loss is also improved as compared to the conventional flange mount termination.

Figure 8:
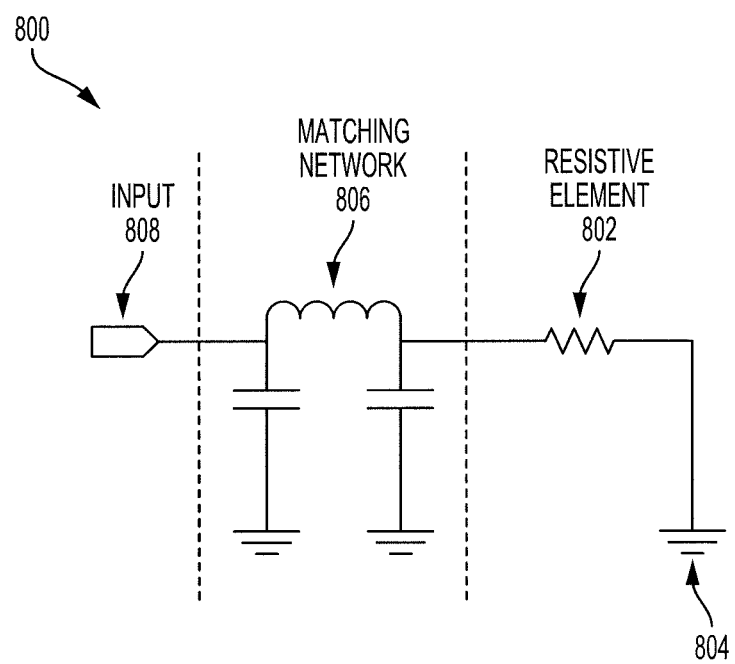
FIG. 8 is a schematic circuit diagram of a chip termination according to an embodiment of the invention.

FIG. 8 is a schematic circuit diagram of a chip termination 800 according to an embodiment of the invention. The chip termination 800 includes an input 808 similar to input contact 308. The chip termination 800 also includes a matching network 806 connected to the input 808. The chip termination 800 also includes a resistive element 802 similar to resistor element 302 connected to the matching network 806. The chip termination 800 also includes a ground 804 similar to ground contact 304.

Figure 9:
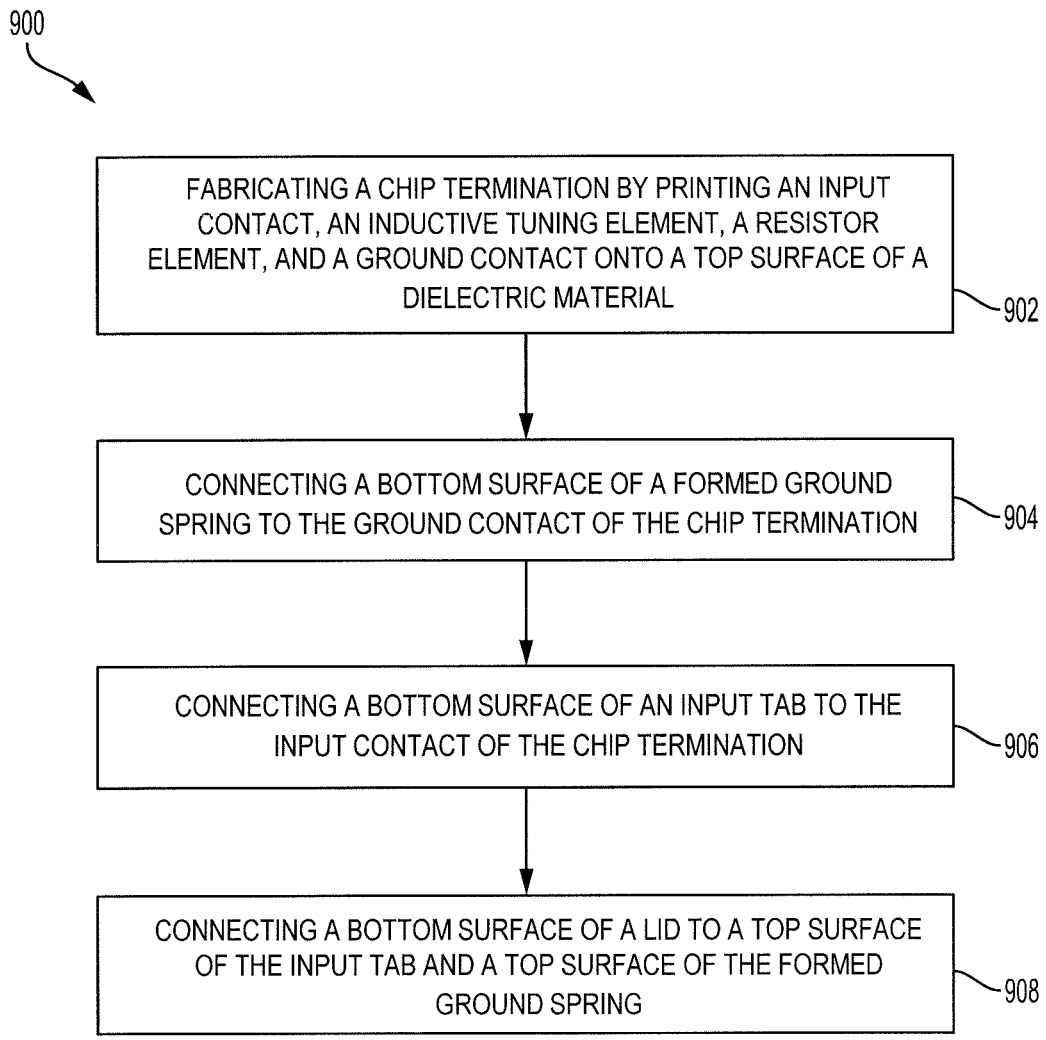
FIG. 9 is a flowchart of steps for manufacturing the integrated spring mounted chip termination according to an embodiment of the invention.

FIG. 9 illustrates a flowchart of steps for manufacturing the integrated spring mounted chip termination according to an embodiment of the invention. A chip termination 110 is fabricated by printing an input contact 308, an inductive tuning element 306, a resistor element 302, and a ground contact 304 onto a top surface 402 of a dielectric material (step 902). In some embodiments, the dielectric material is a ceramic, such as beryllium oxide or aluminum nitride. In some embodiments, the dielectric material is a plastic or a PCB material, such as silicon. The dielectric material may have four sides forming a perimeter 410, and input contact 308 may be printed on a portion of a first side of the four sides. The inductive tuning element 306 may be printed to directly connect to the input contact in an interior portion within the perimeter 410. The resistor element 302 may be printed to directly connect to the inductive tuning element 306 in the interior portion within the perimeter 410. The ground contact 304 may be printed to directly connect to the resistor element 302. The ground contact 304 may be printed along at least a portion of the second side, the third side, and the fourth side of the four sides forming the perimeter 410. In this way, the ground contact 304 may be printed such that the input contact 308, the inductive tuning element 306, and the resistor element 302 are surrounded by the ground contact 304.

A bottom surface 320 of a formed ground spring 106 is connected to the ground contact 304 of the chip termination 110 (step 904). The formed ground spring 106 may be soldered to the chip termination 110, along an interior edge of the body portion 126 of the formed ground spring 106.

A bottom surface 508 of an input tab 102 is connected to the input contact 308 of the chip termination 110 (step 906). A bottom surface 504 of a lid 104 is connected to a top surface 506 of the input tab 102 and a top surface 318 of the formed ground spring 106 (step 908). A gap 128 may be formed between the lid 104 and the chip termination 110. The input tab 102 may be located within a portion of the gap 128. The remaining portion of the gap 128 may be occupied by an epoxy 510, thereby connecting the lid 104 to the chip termination 110.

The foregoing description of the disclosed example embodiments is provided to enable any person of ordinary skill in the art to make or use the present invention. Various modifications to these examples will be readily apparent to those of ordinary skill in the art, and the principles disclosed herein may be applied to other examples without departing from the spirit or scope of the present invention. The described embodiments are to be considered in all respects only as illustrative and not restrictive and the scope of the invention is, therefore, indicated by the following claims rather than by the foregoing description. All changes which come within the meaning and range of equivalency of the claims are to be embraced within their scope.

What is claimed is:

1. An integrated spring mounted chip termination for converting energy of a circuit into heat to be absorbed by a heatsink, the integrated spring mounted chip termination comprising:
    an input tab configured to connect to the circuit;
    a chip termination having a top surface, the chip termination including:

an input contact located on the top surface and configured to connect to the input tab, a resistor element located on the top surface and connected to the input contact, and a ground contact located on the top surface and connected to the resistor element; and a formed ground spring connected to the ground contact of the chip termination, the formed ground spring configured to attach the chip termination to the heatsink, such that the chip termination and the heatsink are in contact.

2. The integrated spring mounted chip termination of claim 1, wherein the formed ground spring provides a clamping force on the chip termination onto the heatsink.

3. The integrated spring mounted chip termination of claim 1, wherein the chip termination has one or more sides forming a perimeter around the top surface, and wherein the ground contact is printed on at least one side of the one or more sides forming the perimeter such that the resistor element is at least partially surrounded by the ground contact.

4. The integrated spring mounted chip termination of claim 1, wherein the chip termination is made of a dielectric material.

5. The integrated spring mounted chip termination of claim 1, wherein a layer of thermal grease is deposited between the chip termination and the heatsink.

6. The integrated spring mounted chip termination of claim 1, further comprising a lid connected to the formed ground spring such that the input tab is located between the lid and the formed ground spring.

7. The integrated spring mounted chip termination of claim 1, further comprising an inductive tuning element connecting the input contact and the resistor element.

8. The integrated spring mounted chip termination of claim 1, wherein the ground contact forms a shape on the top surface of the chip termination, and wherein the formed ground spring has a shape corresponding to the shape of the ground contact.

9. A system for converting energy of a circuit into heat to be absorbed by a heatsink, the system comprising:

an input tab configured to connect to the circuit;

a chip termination having a top surface, the chip termination including:

an input contact printed on the top surface and configured to connect to the input tab, a resistor element printed on the top surface and connected to the input contact, and a ground contact printed on the top surface and connected to the resistor element; and a formed ground spring connected to the ground contact of the chip termination, the formed ground spring configured to attach the chip termination to the heatsink, such that the chip termination and the heatsink are in contact.

10. The system of claim 9, wherein the formed ground spring provides a clamping force on the chip termination onto the heatsink.

11. The system of claim 9, wherein the chip termination has one or more sides forming a perimeter around the top surface, and wherein the ground contact is printed on at least one side of the one or more sides forming the perimeter such that the resistor element is at least partially surrounded by the ground contact.

12. The system of claim 9, wherein the chip termination is made of a dielectric material.

13. The system of claim 9, wherein a layer of thermal grease is deposited between the chip termination and the heatsink.

14. The system of claim 9, further comprising a lid connected to the formed ground spring such that the input tab is located between the lid and the formed ground spring.

15. The system of claim 9, further comprising an inductive tuning element connecting the input contact and the resistor element.

16. The system of claim 9, wherein the ground contact forms a shape on the top surface of the chip termination, and wherein the formed ground spring has a shape corresponding to the shape of the ground contact.

17. A method for manufacturing an integrated spring mounted chip termination comprising:

fabricating a chip termination by printing an input contact, an inductive tuning element, a resistor element, and a ground contact onto a top surface of a dielectric material;

connecting a bottom surface of a formed ground spring to the ground contact of the chip termination;

connecting a bottom surface of an input tab to the input contact of the chip termination; and connecting a bottom surface of a lid to a top surface of the input tab and a top surface of the formed ground spring.

18. The method of claim 17, wherein the forming ground spring is connected to the ground contact of the chip termination by soldering.

19. The method of claim 17, wherein a gap is formed between the lid and the chip termination, and wherein the gap is filled with epoxy such that the lid is connected to the chip termination.

20. The method of claim 17, wherein the top surface of the chip termination has one or more sides forming a perimeter, and the ground contact is printed on at least one of the one or more sides.

* * * * *